United States Patent [19]

Dekker

[11] Patent Number: 5,428,625
[45] Date of Patent: Jun. 27, 1995

[54] METHOD OF CONTROLLING A SELF-TEST IN A DATA PROCESSING SYSTEM AND DATA PROCESSING SYSTEM SUITABLE FOR THIS METHOD

[75] Inventor: Robertus W. C. Dekker, Eindhoven, Netherlands

[73] Assignee: U.S. Philips Corporation, New York, N.Y.

[21] Appl. No.: 192,751

[22] Filed: Feb. 4, 1994

Related U.S. Application Data

[63] Continuation of Ser. No. 664,076, Mar. 4, 1991, abandoned.

[30] Foreign Application Priority Data

Jun. 13, 1990 [NL] Netherlands ............... 9001333

[51] Int. Cl.6 ................ G06F 11/22; G11C 29/00
[52] U.S. Cl. .................... 371/22.3; 371/21.1
[58] Field of Search ............. 371/21.1, 22.3, 22.5

[56] References Cited

U.S. PATENT DOCUMENTS

| | | | |
|---|---|---|---|
| 3,517,171 | 6/1970 | Avizienis ............... | 371/8.1 |
| 4,947,395 | 8/1990 | Bullinger et al. ........ | 371/22.3 |
| 4,951,254 | 8/1990 | Ontrop ................. | 365/201 |
| 5,103,450 | 4/1992 | Whetsel ................ | 371/221 |
| 5,115,435 | 5/1992 | Langford, II et al. .... | 371/22.3 |
| 5,117,393 | 5/1992 | Miyazawa et al. ........ | 365/201 |

OTHER PUBLICATIONS

Little, R. et al., "Built-In Test-Requirements, Issues and Architectures", *TI. Technical Journal*, Jul.-Aug. 1988, pp. 111-122.
Whetsel, L., "A Standard Test Bus and Boundary Scan Architecture", *TI Technical Journal*, Jul.-Aug. 1988, pp. 48-59.
Turino, J., "IEEE P1149 Proposed Standard Testability Bus—An Update with Case Histories", *1988 International Conf. on Computer Design*, pp. 334-337.
LeBlanc, J., "LOCST: A Built-In Self-Test Technique", *IEEE Design & Test*, Nov. 1984, pp. 45-52.
Maunder, C. et al., "Boundary-Scan—A Framework for Structured Design-for-Test", *1987 International Test Conference*, pp. 714-723.
Avra, L., "A VHSIC ETM-Bus-Compatible Test and Maintenance Interface", *1987 International Test Conference*, pp. 964-971.
IEEE Standard Test Access Port and Boundary-Scan Architecture, IEEE STD 1149.1-1990.
R.P. van Riessen, "Designing and Implementing an Architecture with Boundary Scan", IEEE Design & Test of Computers, vol. 7, No. 1, Feb. 90, pp. 9-19.

*Primary Examiner*—Stephen M. Baker
*Attorney, Agent, or Firm*—Laurie Gathman; Anne E. Barschall

[57] ABSTRACT

A method is described, in which a self-test is controlled in a subsystem of a data processing system. Control patterns are transported by the data processing system via a shift register and are then passed to the subsystem via connections used for normal control in the non-testing condition. A characterization of the test result is then loaded again into the shift register via connections also intended for normal use and is subsequently transported by the data processing system. A subsystem suitable for a self-test according to this method is controllable in the self-test condition from a shift register without it being necessary that it is provided with special test connections.

13 Claims, 2 Drawing Sheets

METHOD OF CONTROLLING A SELF-TEST IN A DATA PROCESSING SYSTEM AND DATA PROCESSING SYSTEM SUITABLE FOR THIS METHOD

This is a continuation of application Ser. No. 07/664,076, filed Mar. 4, 1991, now abandoned.

FIELD OF THE INVENTION

The invention relates to a method of controlling a self-test of a subsystem contained in a data: processing system to which the subsystem is connected via input connection means for which, for a normally operating condition, a collection of standard control patterns are defined, which data processing system also comprises serial shift register means with parallel output means.

BACKGROUND OF THE INVENTION

Such a method and a data processing system suitable for this method are known from the I.E.E.E. Test Standard P 1149: "Standard Test Access Port and Boundary-Scan Architecture", (Draft), published by I.E.E.E. Standards Board, Institute of Electrical and Electronics Engineers, Inc.; 345 East 47$^{th}$ Street, New York, N.Y. 10017, U.S.A., more particularly section 6.9. The use of a shift register, in this case indicated as "scan register", is suggested therein as a standard test method: the "(boundary) scan test". In the most frequently occurring conditions, the test is effected in that via the parallel outputs of the scan register a test pattern is supplied to the circuit to be tested. Subsequently, the response to this test pattern is loaded into the register. Test patterns and responses are communicated with the environment whilst being serially shifted. The advantages of this method are:

a) a small number of external connections are required to make a system testable (four in the standard P 1149), b) the test method can be uniformly applied to different systems;

c) with systems comprising different subsystems, test capabilities can be provided by a series arrangement of the registers of the subsystems;

d) the requirements for test capabilities are so simple that they can be added to a system design with a small risk of errors, even automatically with a CAD program.

For these reasons, the boundary scan test is a very suitable test method. In certain cases, however, the method of testing by use of test patterns is unsatisfactory, for example when for a good test a large number of different test patterns are required or when the circuit can have many different conditions, such as, for example, memories, so that a specially designed test program is necessary. In this case, the possibility is described of providing a built-in self-test device in subsystems (P 1149: BIST=Built-In Self-Test). Such a subsystem carries out a self-test program specially designed for the subsystem after a pattern interpreted as a start command has been received from the register. A characterization of the result is then made available via the scan register. Thus, an extensive test can be carded out rapidly, sometimes even in a number of parallel-connected subsystems.

However, in certain cases an insufficient number of (or absolutely no) connections are available to subsystems specially intended for the test. For example, the interface may be standardized, for example for IC types with connections defined for the type, in which event no special test connections are possible. This makes it impossible to include such subsystems in the normal manner in the scan circuit.

SUMMARY OF THE INVENTION

One of the objects of the invention is to reduce the number of connections specially required for controlling tests while maintaining the uniform controllability by use of a scan circuit. The invention further relates to a data processing system comprising:

a subsystem having input connections and at least one output connections which subsystem in an operating condition responds to elements from a first collection of input patterns at the input connections, which are included as admissible pairs of input patterns directly succeeding each other in a second collection of pairs, a serial shift register provided with a parallel output for supplying the input patterns to the input connection, a detector fed by information from the shift register for controlling, in response to previously determined information, the subsystem into a self-test condition and for then supplying a test characterization at the at least one output connection for further evaluation. According to one of its aspects, a self-test is controlled from the shift register via the parallel output and via at least part of the input connection while using a further control pattern at the input connection lying outside the defined collection.

A particular embodiment of the invention is characterized in that via at least part of the output connection, with synchronization by a predetermined succession of input patterns, the characterized result is read out.

The synchronizing control makes it possible to read out the result characterization, as the case may be, only via one connection. Thus, connections specially intended for test output can be economized or can be rendered superfluous.

A particular embodiment of the invention is characterized in that the further control pattern is a predetermined pair of standard control patterns from the collection succeeding each other in time.

In this manner, if in itself there is no instantaneous pattern lying outside the collection of "normal" input patterns, a test control can be realized. It should be noted that devices which are brought into a test condition by a succession of signals are known from the published European Patent 0 317 014. The present application relates to the driving of these signals from the shift register.

DETAILED DESCRIPTION OF THE PREFERRED EMBODIMENTS

Figure 1:
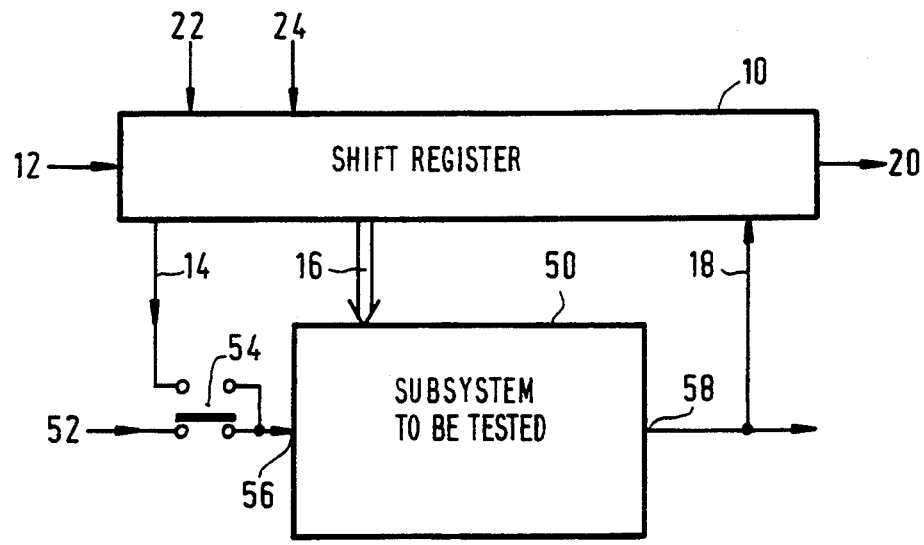
FIG. 1 shows a prior art data processing system with test capabilities as described in the test standard P 1149.

FIG. 1 shows the prior art system having a shift register (10) provided for test purposes, as known from test standard P 1149, and a subsystem (50) to be tested, which is, for example, a memory chip or a memory board. Under the control of a connection (16), the subsystem (50) is either in a normal operating condition or in some test condition.

In the normal condition, the switch (54) is positioned so that the normal input signal (52), which may have a width of a number of lines, is received at the input (56) of the subsystem (50). In the test condition, it is possible to change over the switch (54) with control (16), as a result of which input signal having a width of one or more lines leaves the register (10) via connections (14).

The response of the subsystem (50) produced at the output (58) and representing a characterization of the result of the test can then be loaded into the resister (10) via an input (18).

The kind of test to this response is selected by a signal at the control input (16). It may be a test of the input/output relation of part of combinatorial logic, but it may also be a "Built-in self-test" (BIST), in which the subsystem carries out a program internally. Thus, for example, a test is possible including successive read and write operations to a number of memory locations, after which the response reports locations in which read and write results do not correspond to each other.

The control (16) and the input patterns (14) can be shifted into the register serially via a test input (12). The response can be read out, again serially, via an output (20). With the test standard P 1149, the part of the register (10) connected to the subsystem (50) is included in the subsystem so that for testing four connections the following are required: (TDI) (12) for loading the register, TDO (20) for reading out, TCK (22) for clocking the shift mechanism and (24) TMS for controlling the operation.

Figure 2:
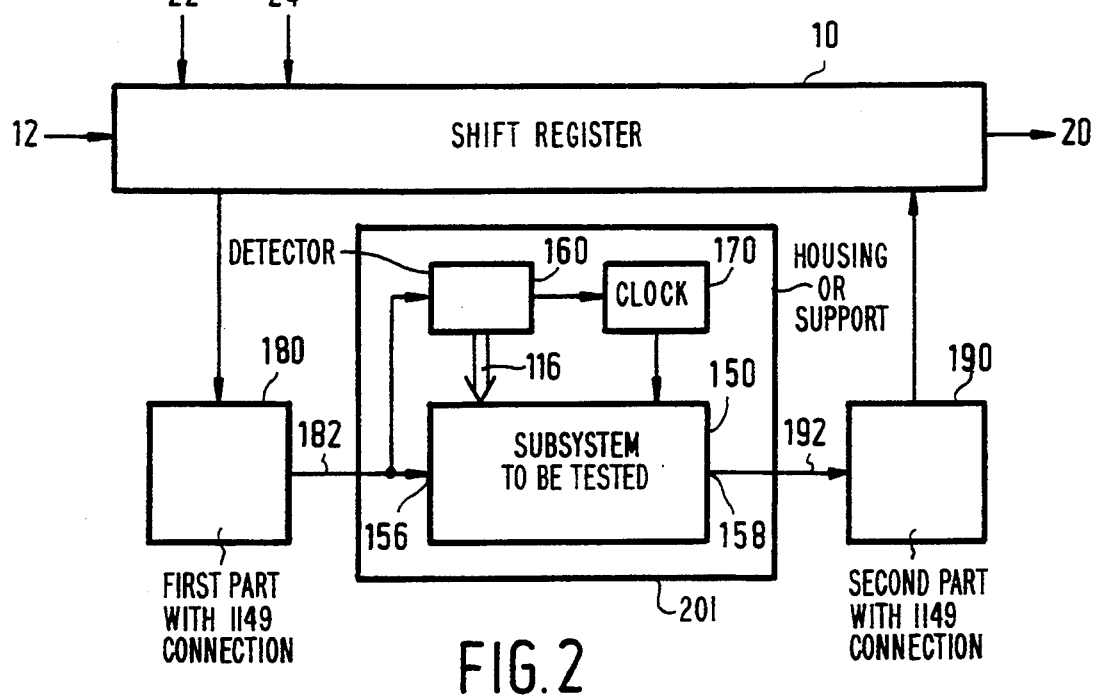
FIG. 2 shows a data processing system with a subsystem which is connected without connections specially intended for test purposes.

FIG. 2 shows a data processing system including a subsystem (150), which is in a separate housing or support (201) which is connected according to the inventor, without according to the invention, without connections specially intended for test purposes to the remainder of the system.

The input of a subsystem (150) is connected to a part (180) of the system, which actually has test connections according to the last standard P 1149. The output is connected to a second part (190), which also has test connections according to P 1149. Thus, the outputs (182) of the first part (180) can be controlled by register (10), as a result of which the input (156) of the subsystem (150) is driven from the register (10). Likewise, signals at the output (158) of the subsystem (150) can be loaded into this register via an input (192) of the second part (190). The control inputs (116) are controlled by a detector (160), which derives a start command from the input signal (156). This detector (160) responds to a predetermined pair of input patterns directly succeeding each other. This predetermined pair of input patterns must not be used during normal operations of subsystem (150).

If the test of the subsystem implies the execution of a program, a clock is required. In case the subsystem does not require a clock in the normal condition, as, for example, in static memories, a clock (170) can be internally provided in the system, which clock is activated by the detector. As an alternative, a clock input could be driven via the normal inputs (156) from the scan register (10), but because in this case the successive pulses must be loaded via the serial input (12), this leads to a lower maximum attainable clock frequency.

After termination of the test, the subsystem must supply the characterization of the result. Frequently, this characterization comprises too many bits to be read out in one operation via the output (158) normally available. For example, with given memory IC's, the output has a width of only one bit. In this case, the characterization is supplied serially in a sequence of parts at the output (158), the input (156) being used as synchronization, which is then controlled via the circuit (180).

Accordingly a subsystem (150) is obtained, which does not require any connection specially intended for test purposes. At the same time, it can actually be tested in a scan test environment so that it also profits from the advantages of the scan test. Viewed from the scan test, it seems as if the subsystem is only a piece of a connection circuit having an input/output relation to be tested, which, however, actually represents a result calculated by a test program.

Figure 3:
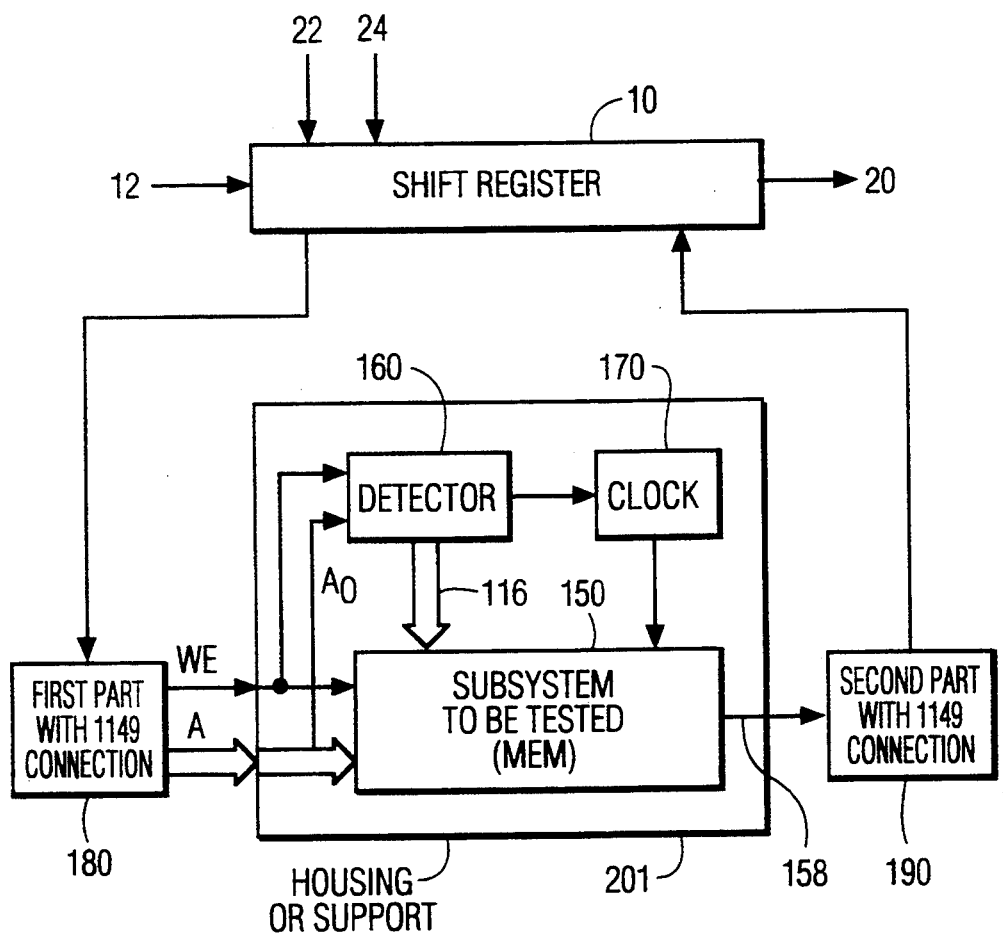
FIG. 3 shows another data processing system according to the invention.

FIG. 3 shows a data processing system similar to that of FIG. 2. Items in FIG. 3 having the same reference numerals as shown in FIG. 2 are the same as the similarly numbered items in FIG. 2. In FIG. 3, the subsystem 150 is a memory, which may include a plurality of memory IC's. The inputs from element 180 include a write enable input (WE) and an address input (A). Beginning of self-test is effected by causing the drive of the address input connection to vary, while at the same time continuously activating the write enable input.

I claim:

1. A method for controlling self-test of a first subsystem contained in a data processing system, the method comprising the steps of:
   supplying a control pattern from parallel outputs of a serial shift register means to input connections of the first subsystem, which control pattern does not occur during normal, non-test operating conditions of the first subsystem, the input connections of the first subsystem also being used during the normal, non-test operating conditions of the first subsystem; and
   initiating the first subsystem to begin the self-test of the first subsystem in response to the control pattern, which control pattern is (i) dedicated to initiate the self-test and (ii) not for the purpose of representing a fault in the data processing system,
   wherein the first subsystem initiates the self-test without requiring additional inputs dedicated to receive the control pattern.

2. The method of claim 1 wherein the data processing system includes a second subsystem coupled between the parallel outputs of the serial shift register means and the input connections and wherein the supplying step occurs via the second subsystem, whereby the first subsystem does not have to be directly connected to the serial shift register means.

3. The method of claim 1, wherein the control pattern is a pair of successive standard patterns which standard patterns appear in the normal, non-test operating conditions of the first subsystem, but which pair does not appear in the normal, non-test operating conditions of the first subsystem.

4. The method of claim 1, further comprising the steps of
   providing a characterization of results of the self-test at output connections of the first subsystem;
   providing a predetermined set of input synchronization patterns from the parallel outputs of the serial shift register to the input connections from the second subsystem; and synchronizing the providing of the characterizations using the predetermined set of input synchronization patterns.

5. A method as claimed in claim 1 or 4, in which the first subsystem is a memory system having a write enable connection and an address input connection, the control pattern is effected by causing the drive of the address input connection to vary, while at the same time the write enable input is continuously activated.

6. A data processing system comprising:
a subsystem having input connections and at least one output connection, which subsystem, under normal, non-test operating conditions, responds to elements from a collection of input patterns at the input connections,
serial shift register means provided with parallel output means for supplying said input patterns to the input connections, and
a detector, included in the subsystem, connected to the input connections, for causing the subsystem to initiate a self-test of the subsystem, in response to a control pattern in which self-test the subsystem supplies a test characterization at said at least one output connection for further evaluation, the control pattern being one which does not appear under the normal, non-test operating conditions of the subsystem, wherein the subsystem initiates the self-test without requiring additional inputs dedicated to receive the control pattern, and wherein the control pattern is (i) dedicated to initiate the self-test and (ii) not for the purpose of representing a fault in the data processing system.

7. A data processing system as claimed in claim 6, characterized in that the first subsystem comprises a clock, and upon the first subsystem initiating a self-test, the clock is started to synchronize execution of a test program.

8. A data processing system as claimed in claim 6, characterized in that the subsystem, in the self-test, supplies the characterization in a sequence of parts synchronized by pairs of input patterns received from the input connections.

9. A data processing system as claimed in claim 6, characterized in that the serial shift register means comprise input means for receiving the test characterization.

10. A subsystem as claimed in claim 6, characterized in that the subsystem is contained in a housing not comprising a connection exclusively intended for test purposes.

11. The system of claim 6, wherein the control pattern is a pair of successive input patterns from the collection, which pair does not occur in succession under the normal, non-test operating conditions.

12. A data processing system as claimed in claim 6, wherein
the subsystem is a memory system having a write enable input connection and an address input connection and
the control pattern to which the detector responds is a continuous activation of the write enable input connection during a variation of a signal present on the address input connection.

13. A data processing system as claimed in claim 12, characterized in that the subsystem is a support with memory IC's disposed thereon, the shift register means being arranged externally of the support.

* * * * *